(12) United States Patent
Hatano et al.

(10) Patent No.: US 8,120,567 B2
(45) Date of Patent: Feb. 21, 2012

(54) SHIFT REGISTER, AND SOLID STATE IMAGE SENSOR AND CAMERA USING SHIFT REGISTER

(75) Inventors: Yuichiro Hatano, Yamato (JP); Fumihiro Inui, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 494 days.

(21) Appl. No.: 12/400,057

(22) Filed: Mar. 9, 2009

(65) Prior Publication Data

US 2009/0174800 A1 Jul. 9, 2009

Related U.S. Application Data

(62) Division of application No. 11/212,674, filed on Aug. 29, 2005, now Pat. No. 7,564,442.

(30) Foreign Application Priority Data

Sep. 2, 2004 (JP) ................................. 2004-255694
Jul. 25, 2005 (JP) ................................. 2005-214228

(51) Int. Cl.
*G09G 3/36* (2006.01)

(52) U.S. Cl. ........ 345/100; 348/222.1; 377/64; 345/204

(58) Field of Classification Search ................ 345/87, 345/98, 99, 100, 207, 204; 348/222.1, 294; 250/208.1; 235/454; 396/96; 377/64, 70–81
See application file for complete search history.

(56) References Cited

U.S. PATENT DOCUMENTS

| | | | | |
|---|---|---|---|---|
| 4,423,935 A | | 1/1984 | Eguchi et al. | 354/402 |
| 4,648,105 A | * | 3/1987 | Priebe et al. | 377/64 |
| 5,386,390 A | * | 1/1995 | Okitaka | 365/230.06 |
| 5,600,127 A | | 2/1997 | Kimata | 250/208.1 |
| 5,883,668 A | * | 3/1999 | Kazama et al. | 348/303 |
| 5,894,143 A | | 4/1999 | Tanigawa et al. | 257/236 |
| 6,061,093 A | | 5/2000 | Yonemoto | 348/305 |
| 6,276,605 B1 | | 8/2001 | Olmstead et al. | 235/462.41 |
| 6,531,690 B2 | | 3/2003 | Kozuka | 250/208.1 |
| 6,573,936 B2 | | 6/2003 | Morris et al. | 348/294 |
| 6,879,313 B1 | | 4/2005 | Kubota et al. | 345/100 |

(Continued)

FOREIGN PATENT DOCUMENTS

| | | |
|---|---|---|
| JP | 62-192097 A | 8/1987 |
| JP | 63-232753 A | 9/1988 |
| JP | 6-338198 A | 12/1994 |

(Continued)

*Primary Examiner* — Lun-Yi Lao
*Assistant Examiner* — Tom Sheng
(74) *Attorney, Agent, or Firm* — Fitzpatrick, Cella, Harper & Scinto

(57) ABSTRACT

The present invention provides a solid state image sensor and a camera using such a solid state image sensor, in which all of stage registers of the shift register can be reset efficiently without increasing the number of pads and/or sensor pins. The solid state image sensor comprises a plurality of photoelectric conversion elements 31 arranged in a two-dimensional array, a vertical shift register 503 disposed in a column direction and a horizontal shift register 504 disposed in a row direction and is characterized in that a timing for controlling resetting means for a first stage register of the shift register differs from a timing for controlling a second stage register and subsequent stage registers. Further, as a concrete example, the second stage register and subsequent stage registers are rest by a pulse for driving the shift register and the first stage register is reset by a pulse in which a high level is reached only upon power ON.

21 Claims, 14 Drawing Sheets

U.S. PATENT DOCUMENTS

| | | | |
|---|---|---|---|
| 7,133,017 B2 * | 11/2006 | Hayashi et al. | 345/100 |
| 7,180,544 B2 | 2/2007 | Yamaguchi et al. | 348/308 |
| 7,187,410 B2 | 3/2007 | Yamaguchi et al. | 348/308 |
| 7,379,108 B2 | 5/2008 | Murakami | 348/302 |
| 7,564,442 B2 * | 7/2009 | Hatano et al. | 345/100 |

FOREIGN PATENT DOCUMENTS

| | | |
|---|---|---|
| JP | 2000-259132 A | 9/2000 |
| JP | 2002-353430 A | 12/2002 |

* cited by examiner

SHIFT REGISTER, AND SOLID STATE IMAGE SENSOR AND CAMERA USING SHIFT REGISTER

CROSS-REFERENCE TO RELATED APPLICATIONS

This application is a division of application Ser. No. 11/212,674, filed Aug. 29, 2005, claims benefit of the filing date of that application under 35 U.S.C. §120, and claims priority benefit under 35 U.S.C. §119 of the filing dates of Japanese Patent Applications Nos. 2004-255694 and 2005-214228, filed Sep. 2, 2004, and Jul. 25, 2005, respectively. The entire disclosures of the three mentioned prior applications are incorporated herein by reference.

BACKGROUND OF THE INVENTION

1. Field of the Invention

The present invention relates to a shift register, and a solid state image sensor using such a shift register and a camera using such a shift register, and more particularly, it relates to a resetting system for a shift register.

2. Related Background Art

FIG. 9 is a circuit diagram showing a conventional XY type solid state image sensor having shift registers and a plurality of photoelectric conversion elements, which was disclosed in Japanese Patent Application Laid-open No. 2002-353430. In FIG. 9, signals read out from a pixel part are successively read and scanned in a vertical shift register 503 and a horizontal shift register 594 and pixel signals are outputted in a time-lapse manner. One pixel is constituted by a photodiode 31, a transfer MOS transistor 32, an amplifying MOS transistor 33, a reset MOS transistor 34 and a selecting MOS transistor 35. A sensor unit is constituted by arranging such pixels in a two-dimensional array.

Further, the vertical shift register 503 performs column scanning of the photodiodes (photoelectric conversion elements) 31 via the election MOS transistors 35 and the horizontal shift resistor 504 performs row scanning of the photodiodes 31 via row selecting MOS transistors 36. Incidentally, since constructions and operations of such vertical shift register 503, horizontal shift register 504 and sensor unit of the solid state image sensor are well-known, detailed explanation thereof will be omitted.

As one of resetting systems for resetting the shift resisters to drive the solid state image sensor, for example, as disclosed in Japanese Patent Application Laid-open No. H06-338198 (1994), a system in which all of stages are reset simultaneously by using an independent reset pulse ΦR is known. An example of an arrangement of such a shift register is shown in FIG. 10.

Incidentally, in this specification, setting to predetermined potential is defined as "reset", which is used hereinafter throughout the specification and claims.

In FIG. 10, a shift register unit 11 is constituted by first and second clock type inverters 12 and 13 which are connected in series, and a reset MOS transistor 14. The reset MOS transistor 14 comprises a P channel MOS transistor connected between an input node of the second clock type inverter and power potential VDD and is provided in a first stage register. Further, an input signal ΦST is inputted to an input of the first clock type inverter 12 and the reset pulse ΦR is inputted to a gate of the reset MOS transistor 14 of a first stage of the shift resister.

By connecting plural shift register units 11 having the above-mentioned construction as a multi-stage in a longitudinal direction, the shift register is formed. Now, a resetting operation of such a shift register having such an arrangement will be described with reference to a timing chart shown in FIG. 11. Before a high level of the start pulse ΦST for driving the shift register is inputted to the shift register, a low level of an external pulse ΦR for resetting all of stages of the shift register is inputted. The reset MOS transistors 14 for the stage resisters of the shift register are turned ON and the first stage register is reset to the power potential VDD.

However, in order to reset the shift register in the above-mentioned manner, it is required that an additional pulse be given from external, with the result that the number of pads and/or sensor pins will be increased. In order to improve this, it is considered to provide a system of FIG. 12 in which, in the resetting operation of the shift register, without resetting the first stage register, a second stage register and subsequent stage resisters (on and after second stage register) are reset by using the start pulse ΦST for the shift register.

In FIG. 12, a shift register unit 20 of the first stage register is constituted by a first inverter unit 25, a second inverter unit 26 and dummy reset MOS transistor 27. The first inverter unit 25 is constituted by a first switch 21 and an inverter 22 which are connected in series. The second inverter unit 26 is constituted by a second switch 23 and an inverter 24 which are connected in series. The dummy reset MOS transistor 27 comprises an N channel MOS transistor connected between an input node of the first inverter and GND potential and is provided in the first stage register.

A shift register 29 for each of the second stage register and subsequent stage registers is constituted by a first inverter unit 25, a second inverter unit 26 and a reset MOS transistor 28. Each of the reset MOS transistors 28 comprises an N channel MOS transistor connected between an input node of the first inverter and GND potential and is provided in each of the second stage register and subsequent stage registers.

A start pulse ΦST for the shift register is inputted to the inputs of the respective first switches. In order to reset the stage registers of the shift register by the start pulse ΦST for the shift register, the gate of the dummy reset MOS transistor 27 of the first stage register is fixed or held to the GND potential.

The shift register is constructed by connecting the shift register unit 20 of the first stage register having such a construction and the shift register units 29 of the second stage register and the subsequent stage registers as a multi stage in a longitudinal direction. Now, a resetting operation of the shift register having such a construction will be described with reference to a timing chart of FIG. 13.

At the same time when a high level of the start pulse ΦST for driving the shift register is inputted to the shift register, the reset MOS transistors 28 for resetting the various stage registers are turned ON, thereby resetting the various stage registers of the shift register to the GND potential. Further, potentials ΦH1, ΦH2 and ΦH3 of the various stage registers in FIG. 13 correspond to potentials of the first to third stage registers in FIG. 12 and φH4 corresponds to the potential of the fourth stage register.

In a case where the shift register is reset in the above-mentioned manner, the resetting of the first stage register of the shift register is not performed. Accordingly, there arose a problem that the first stage register of the shift register becomes unstable to affect the pixel signal.

SUMMARY OF THE INVENTION

The present invention is made in consideration of the above-mentioned conventional problem, and an object of the present invention is to provide a solid image sensor and a camera, in which all of stage registers of a shift register can be reset efficiently without increasing the number of pads and/or sensor pins.

To achieve the above object, the present invention provides a solid state image sensor comprising a plurality of photoelectric conversion elements arranged in a two-dimensional array, a vertical shift register for scanning the photoelectric conversion elements in column-direction, a horizontal shift register for scanning the photoelectric conversion elements in row direction and means for setting various stage registers of the vertical shift register and the horizontal shift register to predetermined potentials and wherein a control timing for controlling the above-mentioned means regarding a first stage register of the vertical shift register or the horizontal shift register differs from a control timing for controlling such means regarding a second stage register and subsequent stage registers thereof.

Further, in the present invention, each of the second stage register and subsequent stage registers of the shift register may be reset by a driving pulse for the shift register and the first stage register is reset by a pulse which reaches a high lever only upon power ON.

In this way, by resetting the first stage register by means of the pulse which reaches the high lever only upon power ON and by resetting the second stage register and subsequent stage registers by means of a start pulse for the shift register, all of the stage registers of the shift register can be reset positively upon power ON.

Further, according to the present invention, in the shift register, the first stage register may be reset by using a pulse internally generated.

By internally generating the reset pulse for the first stage register in this way, a solid stage image sensor can be obtained without requiring for generating independent reset pulse or pulses and without increasing the number of the pads and/or sensor pins.

According to the present invention, by using the resetting means for the first stage register which differ from the resetting means for the second stage register and subsequent stage registers, without increasing the number of new pads and/or sensor pins, any influence which would be generated if the first stage register is not reset can be prevented from affecting upon the image signal. Accordingly, the shift resistors provided in the solid state image sensor can be reset efficiently.

Further, the present invention provides a shift register comprising means for setting various stage registers to predetermined potentials and wherein a control timing for controlling said means regarding a first stage register of said shift register differs from a control timing for controlling said means regarding a second stage register and subsequent stage registers thereof.

In this way, it is possible to provide a shift register in which all of the stage registers can be reset efficiently without increasing the number of control pins and which has no output dispersion.

DESCRIPTION OF THE PREFERRED EMBODIMENTS

Now, embodiments of the present invention will be fully explained with reference to the accompanying drawings.

First Embodiment

Figure 1:
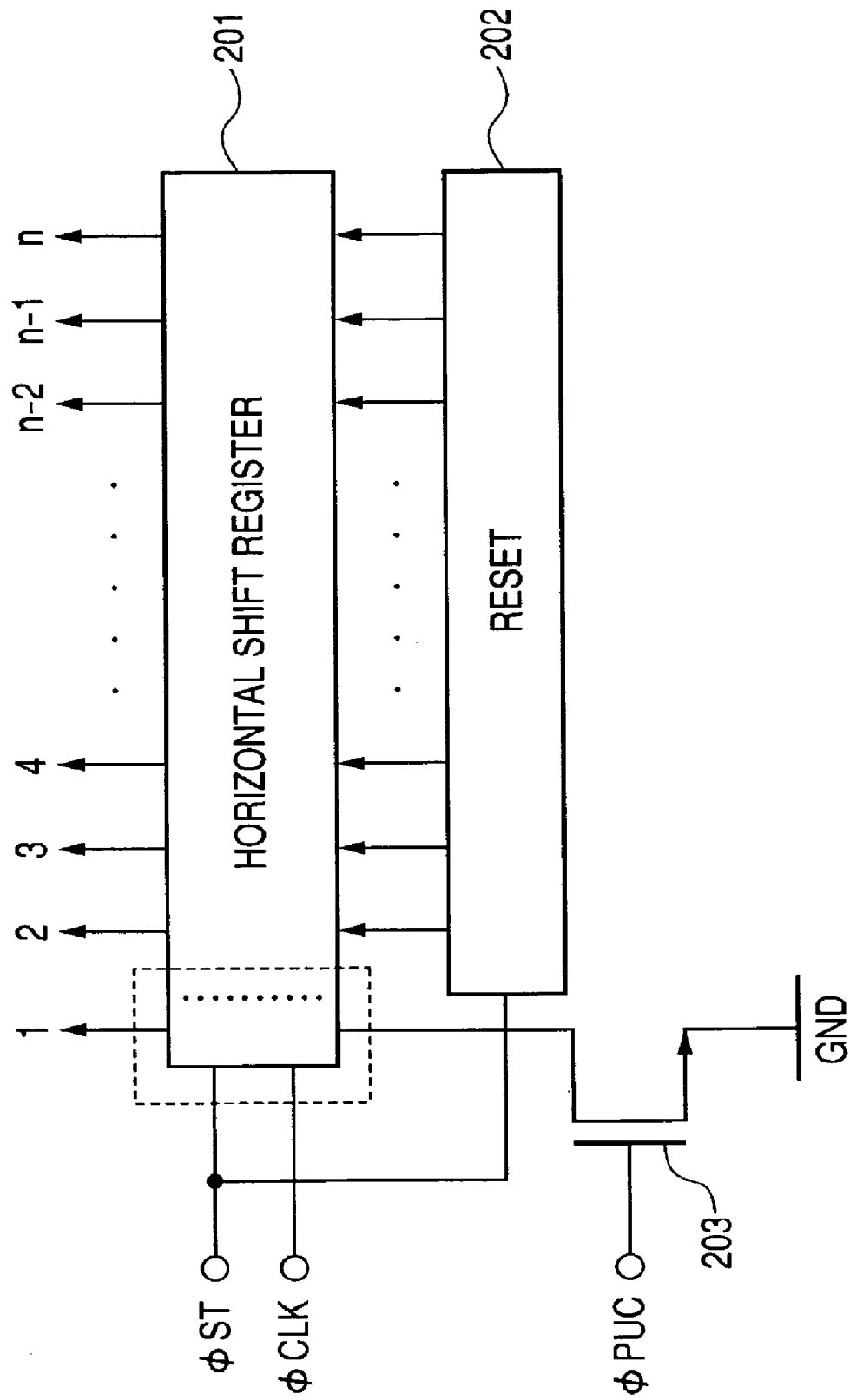
FIG. 1 is a functional block diagram for explaining a shift register according to the present invention.
Figure 9:
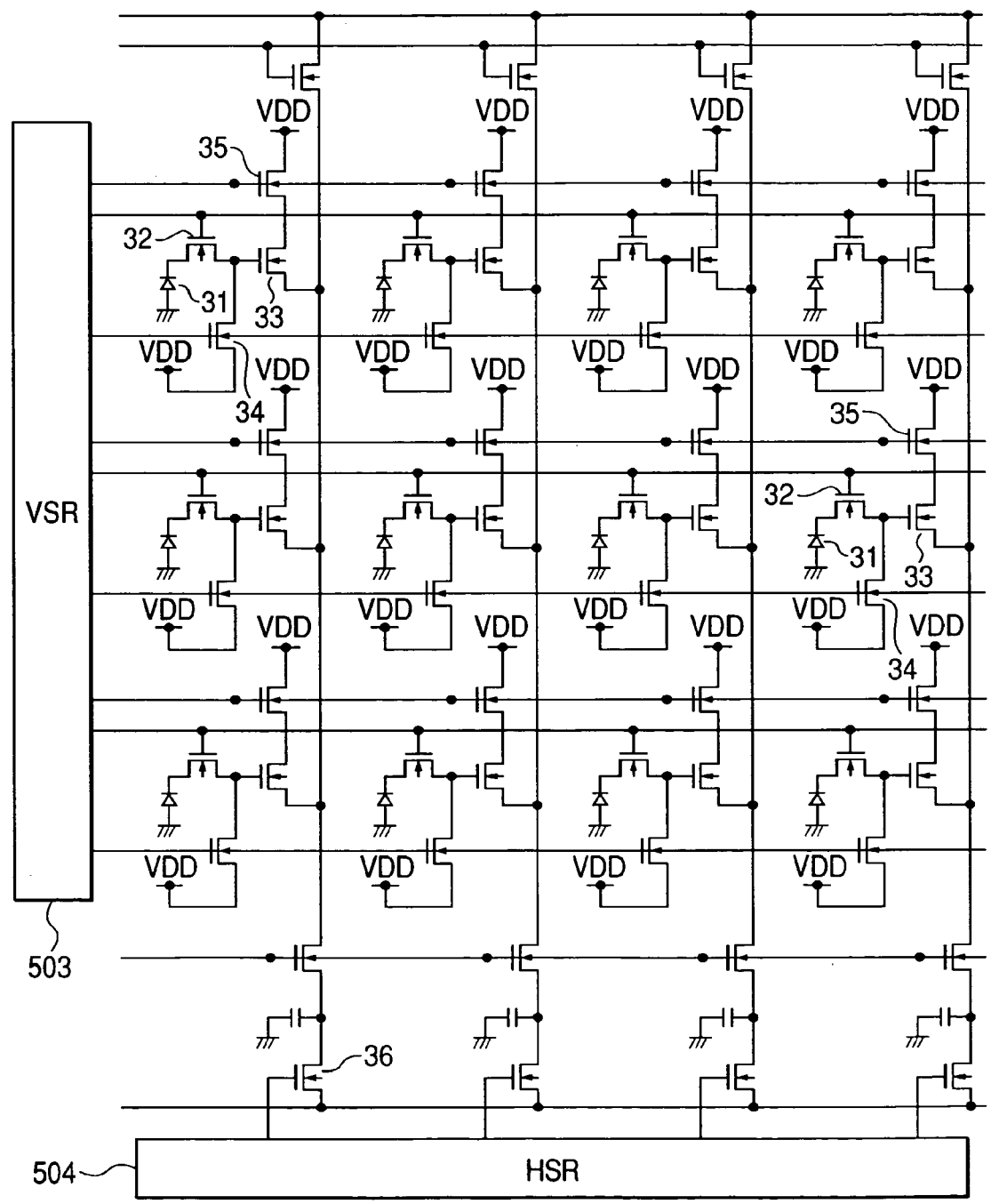
FIG. 9 is a block diagram showing a conventional XY address type solid stage image sensor.
Figure 10:
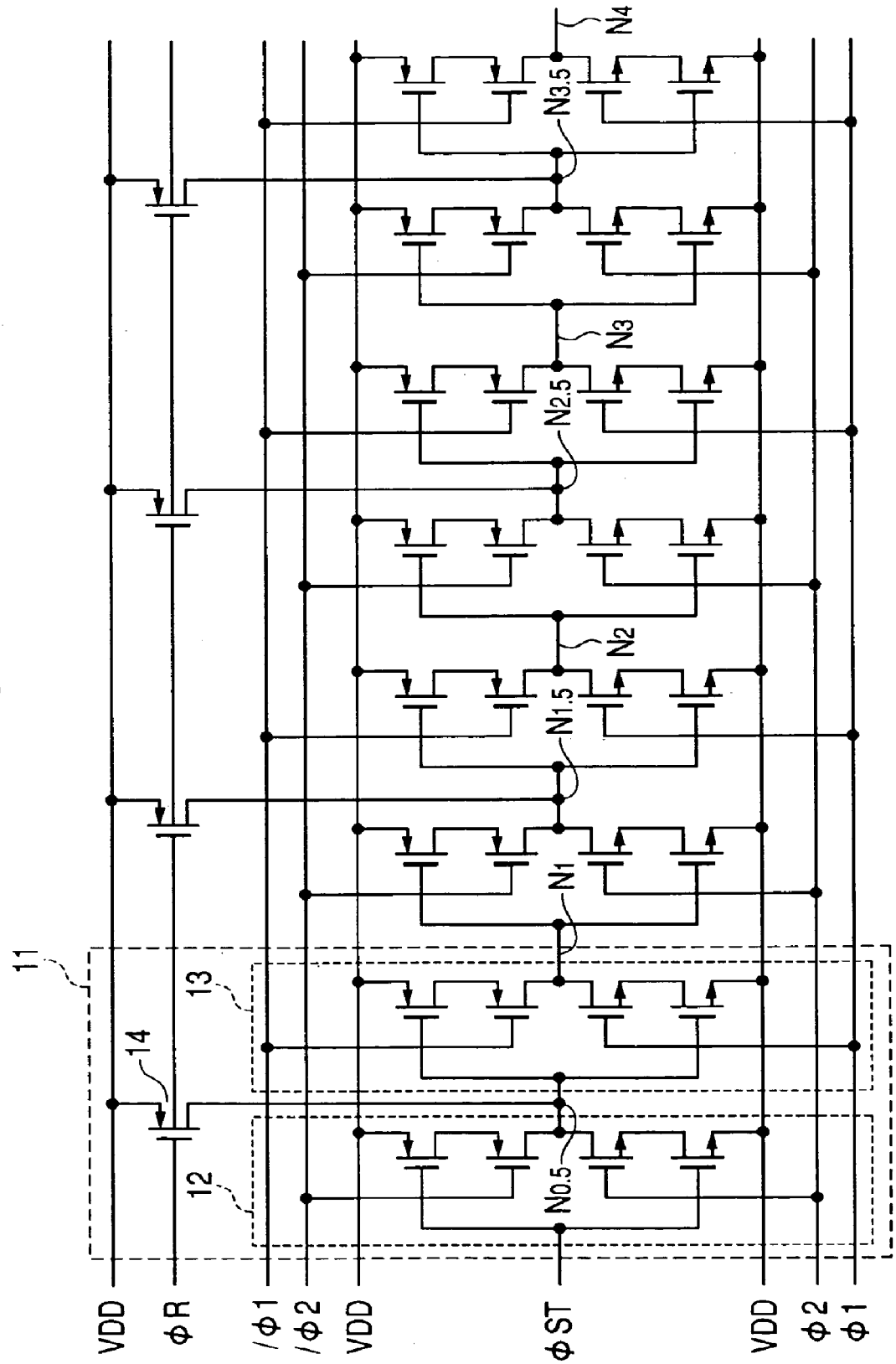
FIG. 10 is a circuit diagram showing a conventional shift register.
Figure 11:
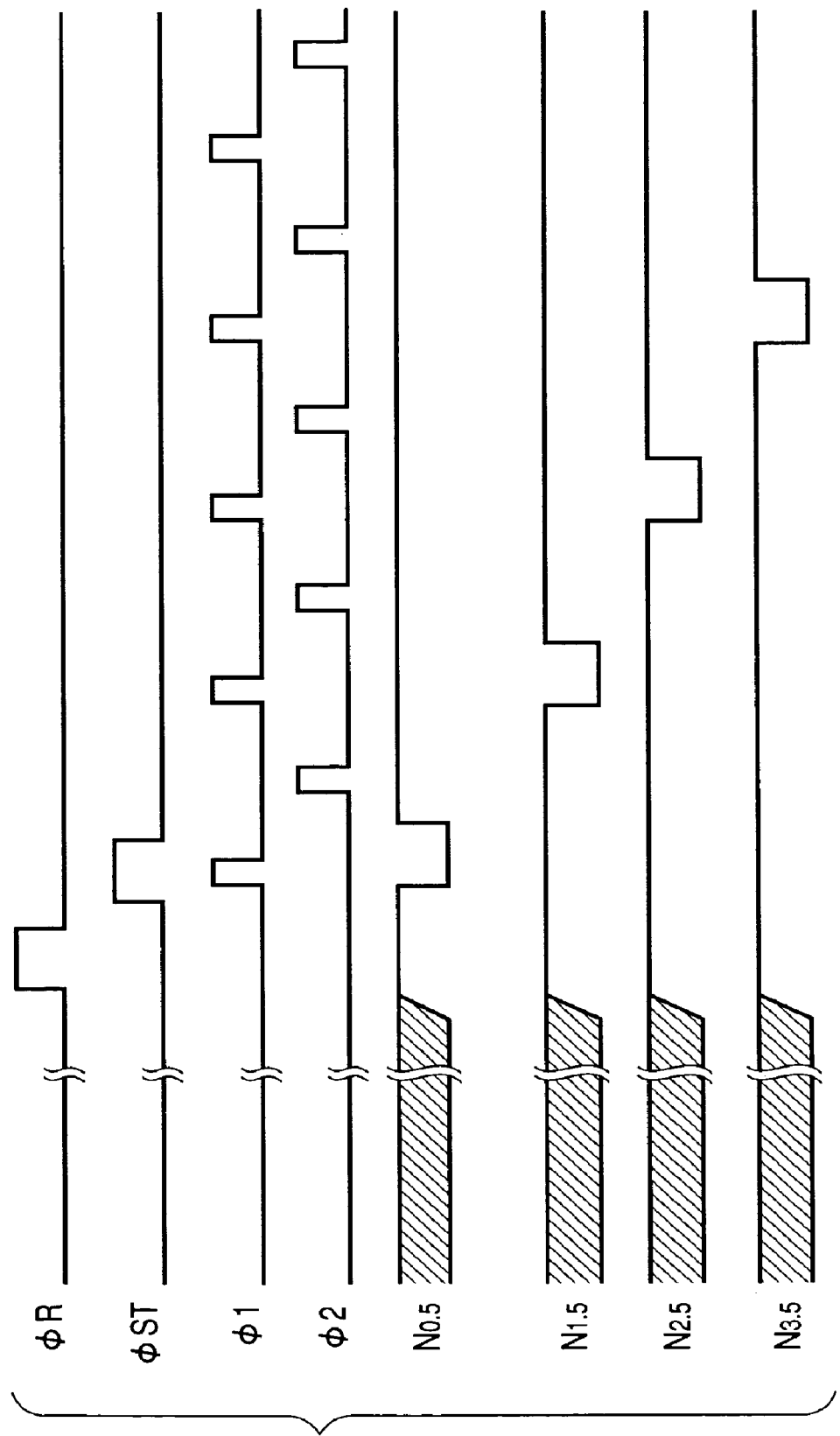
FIG. 11 is a timing chart for explaining a resetting operation of the shift register of FIG. 10.
Figure 12:
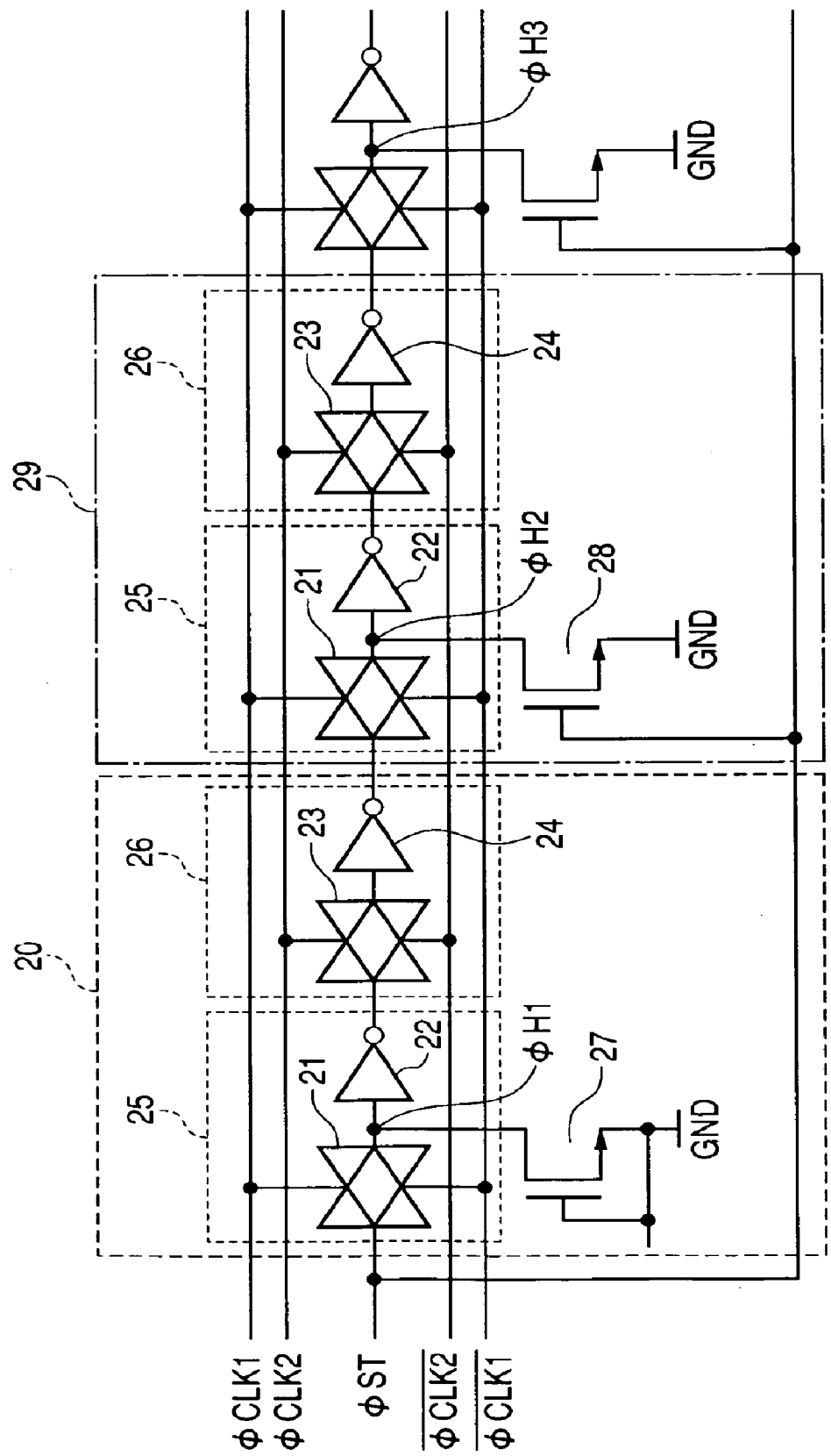
FIG. 12 is a circuit diagram showing resetting means of a conventional shift register.
Figure 13:
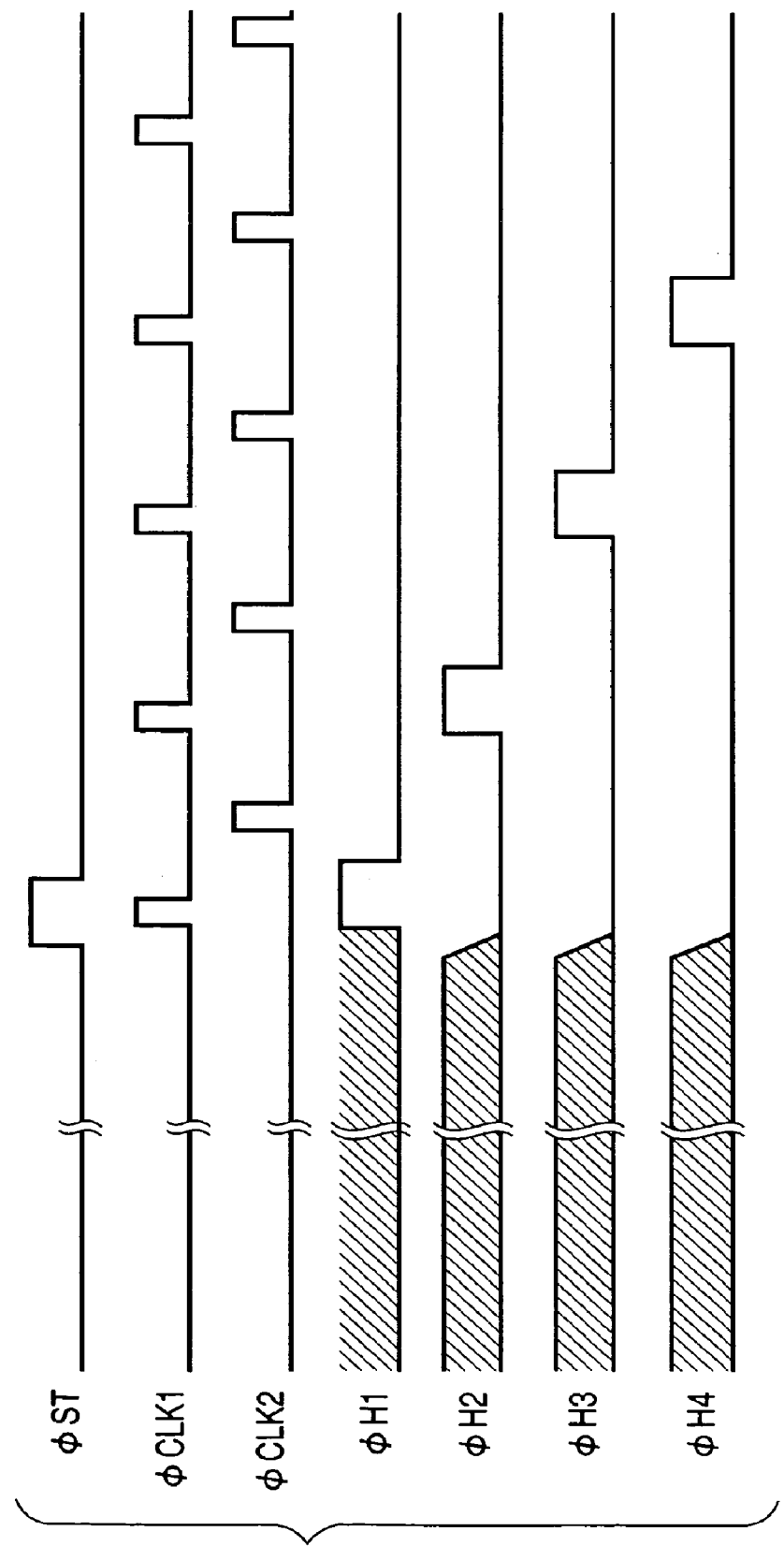
FIG. 13 is a timing chart for explaining a resetting operation of the shift register of FIG. 10.

FIG. 1 is a functional block diagram for explaining a shift register according to the present invention. First of all, a horizontal shift register 201 corresponds to the horizontal shift register 504 shown in FIG. 9 and a reset circuit 202 is a reset circuit for resetting the shift register 201. The reset circuit 202 corresponds to a reset MOS transistor 58 for a second stage register and subsequent stage registers which will be described later and a MOS transistor 203 corresponds to a reset MOS transistor 57 for a first stage register, which will be described later. Incidentally, in FIG. 1, while only the horizontal shift register 201 was shown, resetting means according to the present invention can also be applied to the vertical shift register 503 of FIG. 9.

Figure 2:
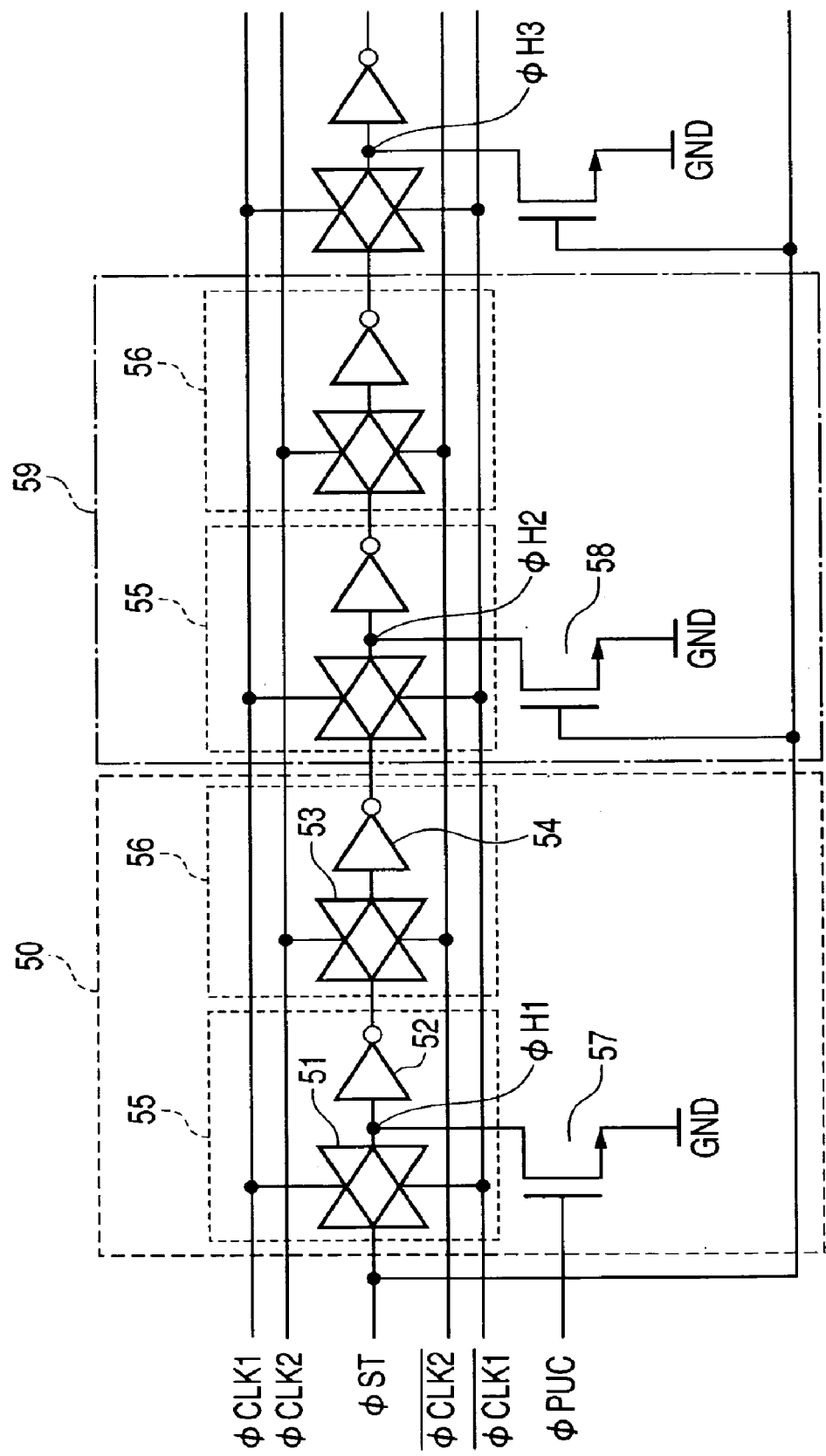
FIG. 2 is a circuit diagram showing a first embodiment of the present invention.

FIG. 2 is a circuit diagram showing a first embodiment of a shift register according to the present invention in which resetting means for the first stage register differ from resetting means for the second stage register and subsequent stage registers. The shift register corresponds to the vertical shift register 503 and the horizontal shift register 504 shown in FIG. 9, respectively. Further, in FIG. 2, while elements other than the shift register were omitted, the other elements of a solid state image sensor according to the present invention are similar to those shown in FIG. 9. Incidentally, it should be noted that the arrangement of the pixel is not limited to the arrangement shown in FIG. 9 but various arrangements can be used. This is also true regarding other embodiments.

In FIG. 2, a shift register unit 50 of the first stage register is constituted by a first inverter unit 55, a second inverter unit 56 and a reset MOS transistor 57. The first inverter unit 55 is constituted by a first switch 51 and an inverter 52 which are connected in series. The second inverter unit 56 is constituted by a second switch 53 and an inverter 54 which are connected in series. The reset MOS transistor 57 comprises an N channel MOS transistor connected between an input node of the first inverter and GND potential and is provided in the first stage register.

Further, a shift register unit 29 for each of the second stage register and subsequent stage registers is constituted by a first inverter unit 55, a second inverter unit 56 and a reset MOS transistor 58. Each of the reset MOS transistors 58 comprises an N channel MOS transistor connected between an input node of the first inverter and GND potential and is provided in each of the second stage register and subsequent stage registers.

A start pulse ΦST for the shift register is inputted to an input of the first switch 51 and a reset pulse ΦPUC is inputted to a gate of the reset MOS transistor 57 of the first stage register of the shift register. The start pulse ΦST for the shift register is inputted to the reset MSO transistors 58 of the second stage register and subsequent stage registers.

Figure 3:
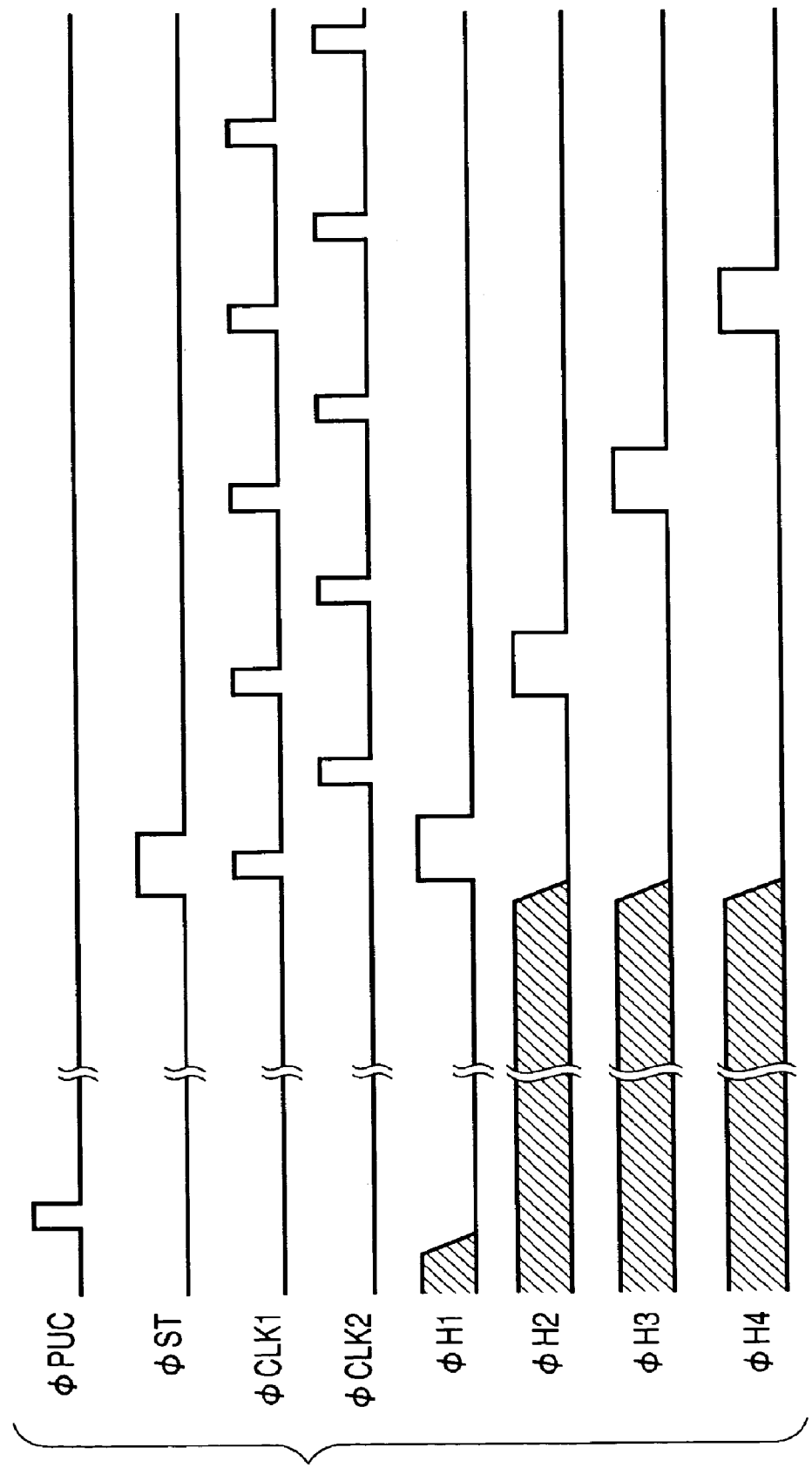
FIG. 3 is a timing chart for explaining an operation of the first embodiment.

The shift register is constructed by connecting the shift register unit 50 of the first stage register having such a construction and the shift register units 59 of the second stage register and the subsequent stage registers as a multi stage in a longitudinal direction. A resetting operation of the shift register having such a construction will now be described with reference to a timing chart of FIG. 3.

Before a high level of the start pulse φST for driving the shift register is inputted to the shift register, a high level of the internally generated pulse ΦPUC for resetting the first stage register is inputted. As a result, the reset MOS transistor 57 of the first stage register is turned ON, thereby resetting the first stage register to the GND potential.

Then, after the start pulse ΦST becomes a high level condition, the second stage register and subsequent stage registers of the shift register are reset. In this case, immediately after the reset MOS transistors 58 of the second stage register and subsequent stage registers are turned ON, the first switches are in an OFF condition; if the first switches are turned ON, the second stage register and subsequent stage registers may not be reset. Also in this case, since the second switches are in an OFF condition, at least upon resetting the second stage register and subsequent stage registers, the low level and the high level are not met in the first switch.

Figure 4:
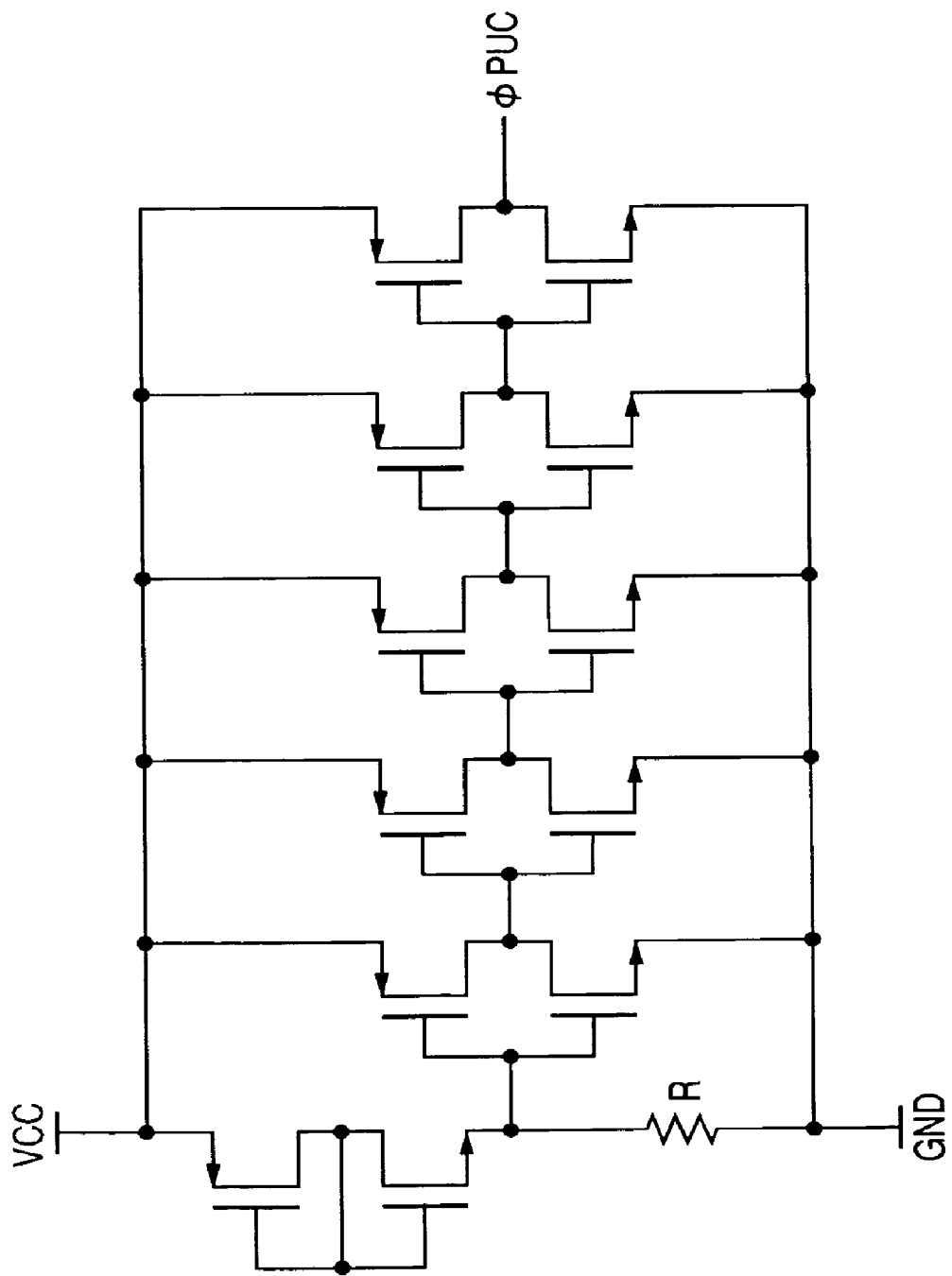
FIG. 4 is a circuit diagram showing an example of a circuit for generating a reset pulse for resetting a first stage register, used in the first embodiment.

Here, the reset pulse ΦPUC for resetting the first stage register of the shift register is inputted only upon the power ON, and this pulse is generated in a circuit arrangement as shown in FIG. 4. FIG. 4 is a schematic view showing a circuit arrangement for generating a pulse in which a high level is reached only upon the power ON and a low level is always maintained thereafter. When the reset pulse ΦPUC is used to reset the first stage register, the following operation may be performed. That is to say, when an output part of the shift register is connected to a gate of the MOS transistor of a selecting line or an output line of the sensor, the output parts of the second stage register and subsequent stage registers of the shift register are used by shifting one stage of the output part of the shift register. In this way, a normal sensor operation can be realized.

Second Embodiment

Figure 5:
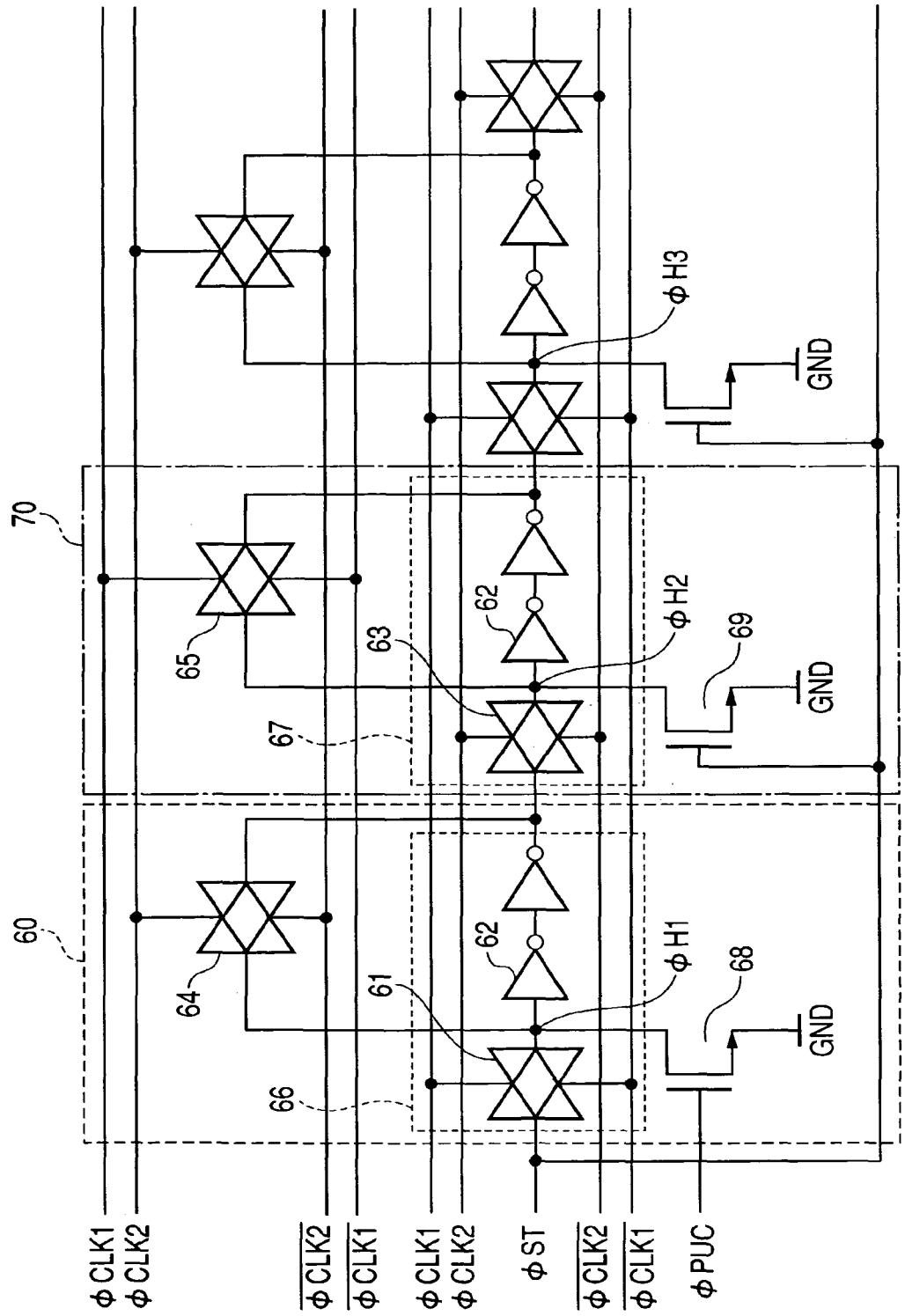
FIG. 5 is a circuit diagram showing a second embodiment of the present invention.

FIG. 5 is a circuit diagram showing a second embodiment of a shift register according to the present invention, in which resetting means for the first stage register differ from resetting means for the second stage register and subsequent stage registers. This shift register corresponds to the vertical shift register 503 and the horizontal shift register 504 shown in FIG. 9, respectively. Further, in FIG. 5, while elements other than the shift register were omitted, the other elements of a solid state image sensor according to the present invention are similar to those shown in FIG. 9.

In FIG. 5, a shift register unit 60 of the first stage register is constituted by a first inverter unit 66, a third switch 64 and a reset MOS transistor 68. The first inverter unit 66 is constituted by connecting a first switch 61 to a second stage of an inverter 62 in series. The third switch 64 is used as a feedback function for holding potential in the first inverter unit 66 when the first switch 61 is turned OFF. The reset MOS transistor 68 comprises an N channel MOS transistor connected between an input node of the inverter and GND potential and is provided in the first stage register.

Further, a shift register unit 70 for each of the second stage register and subsequent stage registers is constituted by a second inverter unit 67, a fourth switch 65 and a reset MOS transistor 69. The second inverter unit 67 is constituted by connecting a second switch 63 to a second stage of the inverter 62 in series. The fourth switch 65 is used as a feedback function for holding potential in the second inverter unit 67 when the second switch 63 is turned OFF. Each of the reset MOS transistors 69 comprises an N channel MOS transistor connected between an input node of the inverter and GND potential and is provided in each of the second stage register and subsequent stage registers.

A start pulse ΦST for the shift register is inputted to an input of the first switch 61. A reset pulse ΦPUC is inputted to a gate of the reset MOS transistor 68 of the first stage register of the shift register. The start pulse ΦST for the shift register is inputted to the reset MSO transistors 69 of the second stage register and subsequent stage registers.

Figure 6:
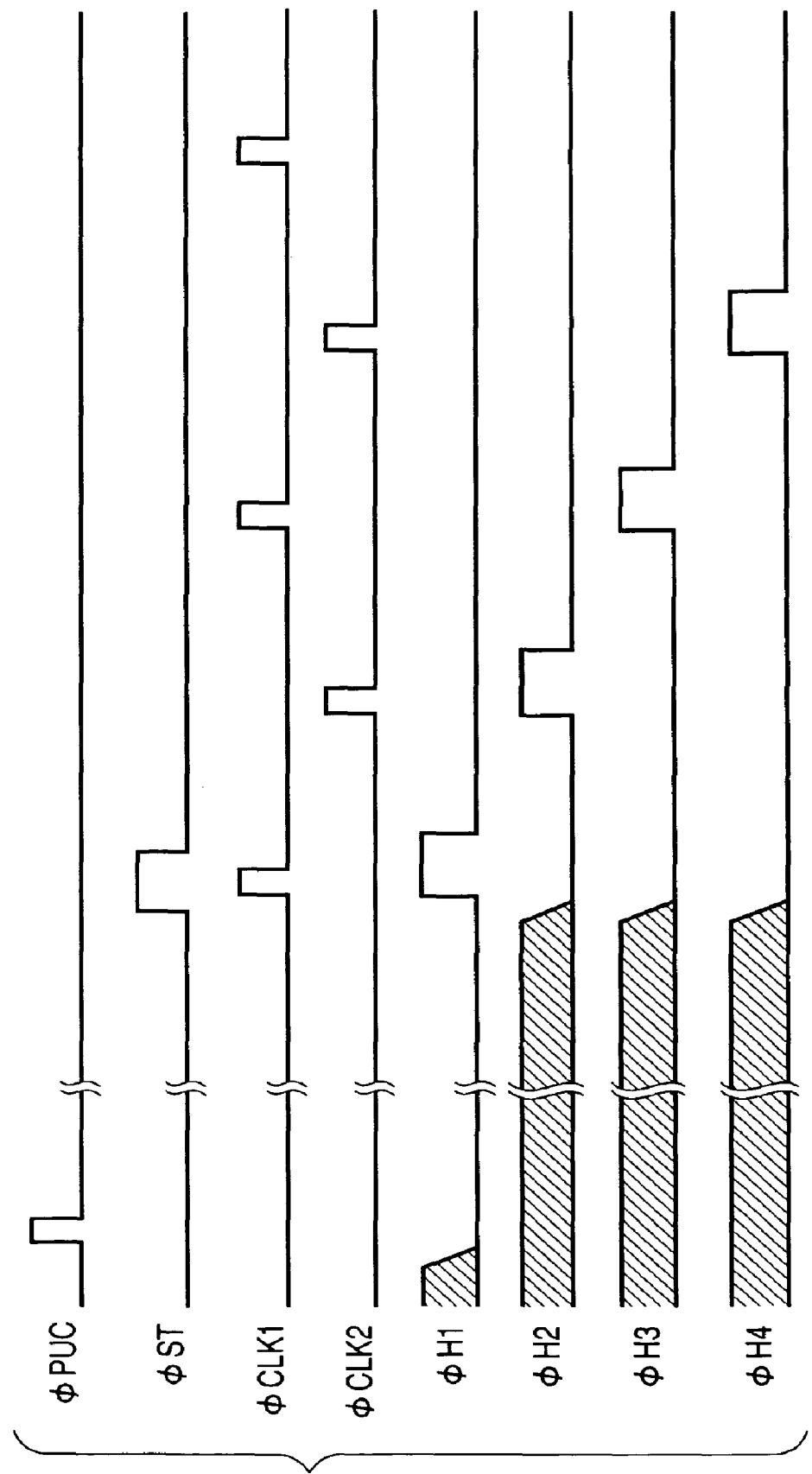
FIG. 6 is a timing chart for explaining an operation of the second embodiment.

The shift register is constructed by connecting the shift register unit 60 of the first stage register having such a construction and the shift register units 70 of the second stage register and the subsequent stage registers as a multi stage in a longitudinal direction. A resetting operation of the shift register having such a construction will now be described with reference to a timing chart of FIG. 6.

Before a high level of the start pulse ΦST for driving the shift register is inputted to the shift register, a high level of the internally generated pulse ΦPUC for resetting the first stage register is inputted. As a result, the reset MOS transistor 68 of the first stage register is turned ON, thereby resetting the first stage register to the GND potential.

Then, after the start pulse ΦST becomes a high level condition, the second stage register and subsequent stage registers of the shift register are reset. In this case, immediately after the reset MOS transistors of the second stage register and subsequent stage registers are turned ON, the first switches are in an OFF condition; if the first switches are turned ON, the second stage register and subsequent stage registers may not still be reset. Also in this case, since the second switches are in an OFF condition, at least upon resetting the second stage register and subsequent stage registers, the low level and the high level are not met in the first switch.

Third Embodiment

A circuit arrangement of a shift register according to a third embodiment of the present invention, in which resetting means for the first stage register differ from resetting means for the second stage register and subsequent stage registers, is similar to those shown in FIGS. 2 and 5. However, in circuit arrangement according to the third embodiment, a reset pulse inputted to the first stage register, a reset pulse inputted to the second stage register and subsequent stage registers and a start pulse for the shift register are generated within the sensor.

That is to say, a circuit for generating the above-mentioned pulses is added to the shift register shown in FIG. 2 or FIG. 5. Further, in this embodiment, while only a circuit of FIG. 7 which will be described later was shown, the other elements of a solid state image sensor according to the third embodiment is similar to those shown in FIG. 9.

Figure 7:
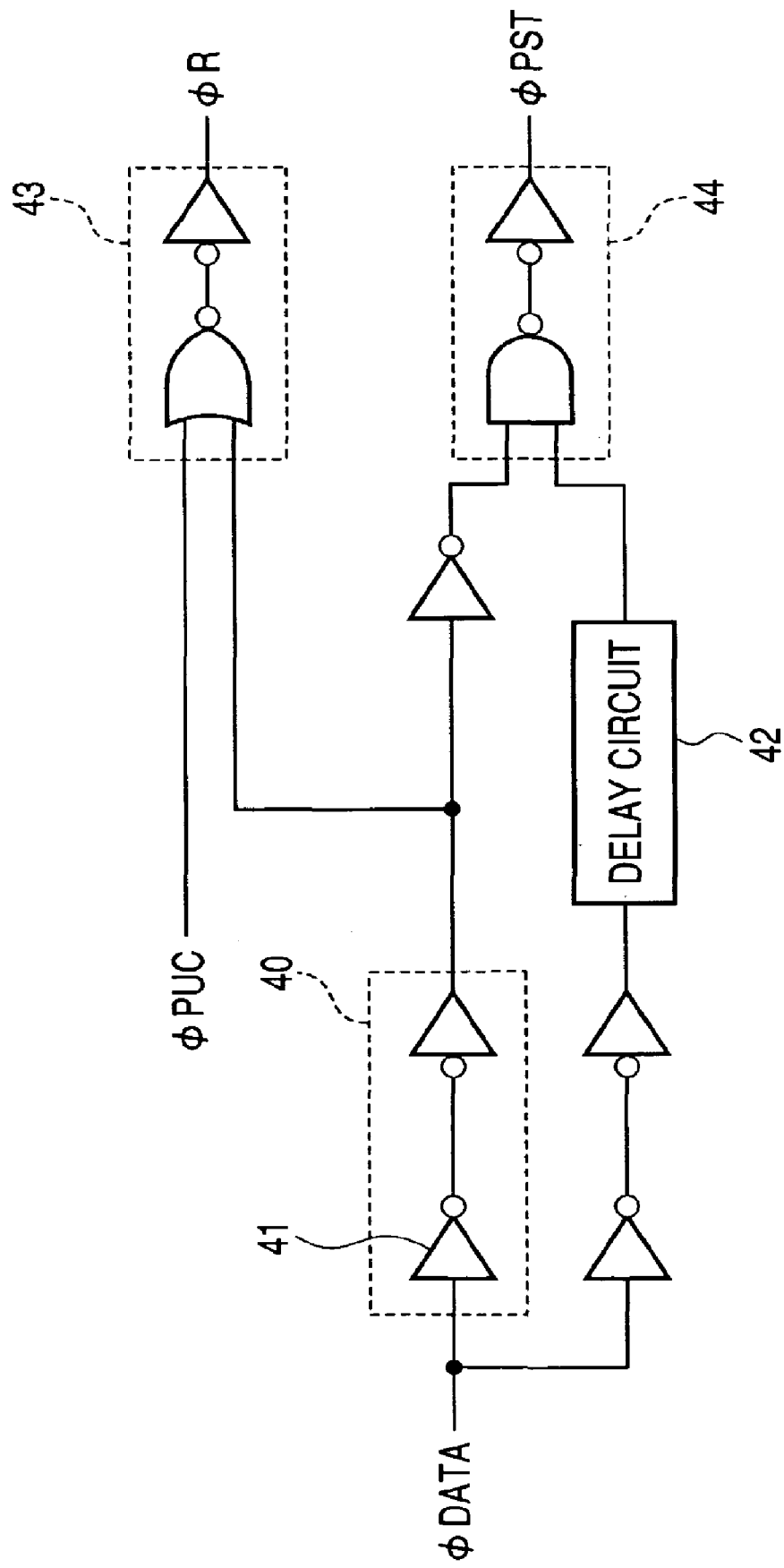
FIG. 7 is a circuit diagram showing a third embodiment of the present invention.

FIG. 7 is a circuit diagram showing the third embodiment. In FIG. 7, an inverter unit 40 is constituted by connecting two inverters 41 in series. A data pulse ΦDATA is inputted to the inverter unit 40. A pulse ΦR generated by an OR circuit 43 for selecting OR between the data pulse ΦDATA and a pulse ΦPUC reaching a high level only upon the power ON and generated in FIG. 5 becomes a reset pulse inputted to a gate of the reset MOS transistor of the first stage register.

Further, a pulse ΦPST is generated by an AND circuit 44 for selecting AND between a reverse pulse of the data pulse ΦDATA and a pulse obtained by delaying the data pulse by means of a delay circuit 42. The pulse ΦPST becomes a reset pulse inputted to the gates of the reset MOS transistors of the second stage register and subsequent stage registers of the shift register and a start pulse for driving the shift register. By using the circuit so constructed as a reset pulse generating circuit of the shift register, the reset pulse for the first stage register and the reset pulse for the second stage register and subsequent stage registers can perform the automatic resetting, not only when the power is turned ON but also when the start pulse is inputted to the shift register again.

Here, in the first to third embodiments, when the following events occur, the vertical shift register and the horizontal shift register are reset: namely, upon power ON, or when outputting of a signal corresponding to 1 frame is completed in the vertical shift register, or after signal carriers accumulated in the horizontal shift register are read by an amount corresponding to one-scanning in a horizontal period, or the like.

Fourth Embodiment

Figure 8:
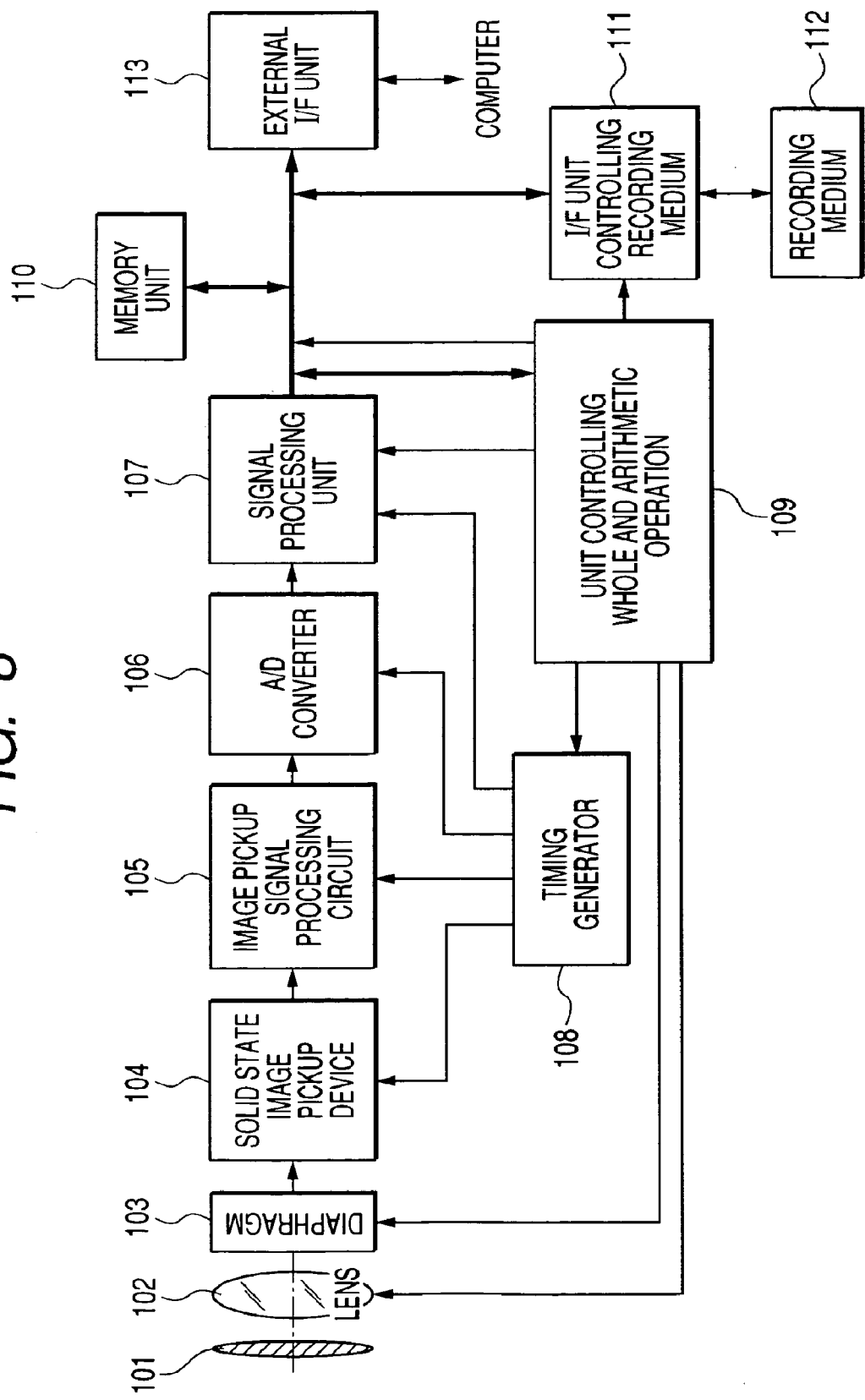
FIG. 8 is a block diagram showing an embodiment of a camera using a solid state image sensor of the present invention.

FIG. 8 is a block diagram showing an embodiment of a still camera using the above-mentioned solid state image sensor according to the present invention. In FIG. 8, the reference numeral 101 designates a barrier serving to protect a lens and also acting as a main switch; 102 designates a lens for focusing an optical image of an object onto a solid state image sensor 104; and 103 designates a diaphragm for variably adjusting a light amount passed through the lens 102. The reference numeral 104 designates a solid state image sensor for taking-in the object focused by the lens 102 as an image signal. The solid state image sensor 104 corresponds to the above-mentioned solid state image sensor according to the present invention.

Further, the reference numeral designates an A/D converter for performing analogue/digital conversion of the image signal outputted from the solid state image sensor 104; and 107 designates a signal processing unit for performing various corrections and/or data compression with respect to image data outputted from the A/D converter 106. Further, the reference numeral 108 designates a timing generator for outputting various timing signals to the solid state image sensor, an image pickup signal processing circuit 105, the A/D converter 106 and the signal processing unit 107.

Further, the reference numeral 109 designates a unit controlling whole and arithmetic operation for performing various arithmetic operations and for controlling the whole still video camera; 110 designates a memory unit for temporarily storing the image data; and 111 designates an I/F (interface) unit controlling recording medium for performing recording or reading-out with respect to a recording medium. Further, the reference numeral 112 designates a removable recording medium such as a semiconductor memory for performing recording or reading-out of the image data; and 113 designates an external I/F (interface) for performing communication to an external computer and the like.

Next, a photo-taking operation of the still video camera according to the illustrated embodiment will be explained. First of all, when the barrier 101 is opened, a main power source is turned ON and then a power source of a control system are turned ON and further power source of a image sensor system such as the A/D converter 106 and the like is turned ON. Thereafter, the unit 109 controlling whole and arithmetic operation opens the diaphragm 103 to control an exposure amount, and the signal outputted from the solid state image sensor 104 is A/D-converted in the A/D converter 106 and then is inputted to the signal processing unit 107. On the basis of the data, the unit 109 controlling whole and arithmetic operation performs arithmetic operation of the exposure.

The brightness is judged on the basis of a result of such photometry, and the unit 109 controlling whole and arithmetic operation controls the diaphragm 103 in accordance with the obtained result.

Then, on the basis of the signal outputted from the solid state image sensor 104, at the unit 109 controlling whole and arithmetic operation, a high frequency component is picked up and a distance up to the object is calculated. Thereafter, by driving the lens 102, it is judged whether the focusing is achieved or not. If it is judged that the focusing is not achieved, the lens 102 is driven again to perform photometry. After the focusing is ascertained, main exposure is started.

When the exposure is finished, the image signal outputted from the solid state image sensor 104 is A/D-converted in the A/D converter 106 and then passes through the signal processing unit 107 and is written in the memory unit 110 by unit 109 controlling whole and arithmetic operation. Thereafter, the data accumulated in the memory unit 110 passes through the I/F unit 111 controlling recording medium and is recorded on the removable recording medium 112 such as the semiconductor memory, under the control of unit 109 controlling whole and arithmetic operation. Further, the data may be inputted to a computer and the like directly through the external I/F unit 113 to work the image.

Fifth Embodiment

An embodiment in which the solid state image sensor according to the present invention is applied to a video camera will be fully explained with reference to FIG. 14.

Figure 14:
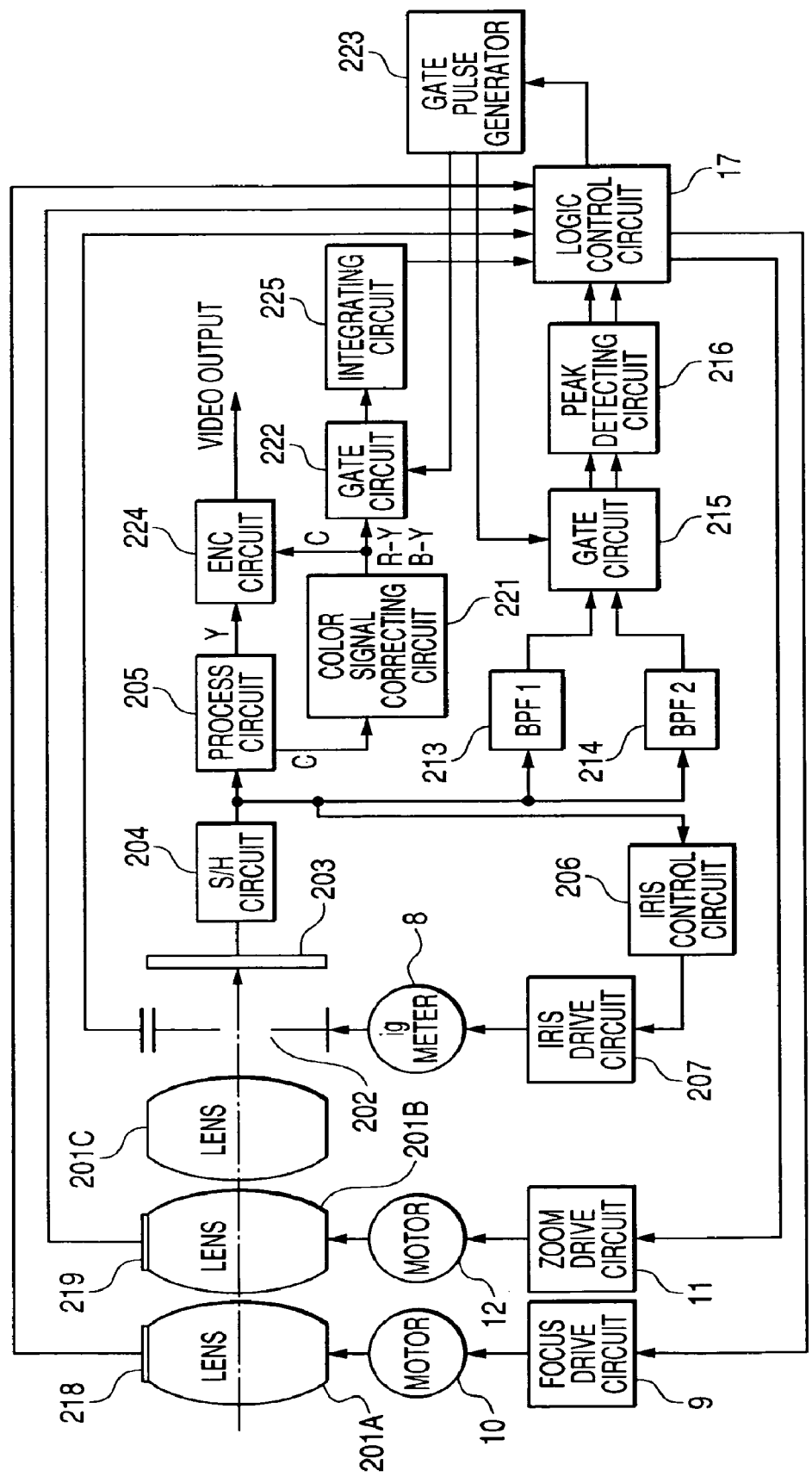
FIG. 14 is a showing an embodiment of a video camera using the solid state image sensor of the present invention.

FIG. 14 is a block diagram showing a case where the solid state image sensor according to the present invention is applied to the video camera. In FIG. 14, a photo-taking lens 201 comprises a focusing lens 201A for performing focus adjustment, a zoom lens 201B for performing a zooming operation and a lens 201C for focusing an image.

The reference numeral 202 designates a diaphragm; and 203 designates a solid state image sensor according to the present invention in which an image of an object focused on an image sensor surface is photo-electrically converted to convert it into an electrical image pickup signal. The reference numeral 204 designates a sample hold circuit (S/H circuit) for sample-holding the image pickup signal outputted from the solid state image sensor 203 and for amplifying a level, which S/H circuit outputs a picture signal.

The reference numeral 205 designates a process circuit for performing predetermined processing such as gamma correction, color separation and blanking processing with respect to the picture signal outputted from the sample hold circuit 204, which process circuit outputs a luminance signal Y and a chroma signal C. The chroma signal C outputted from the process circuit 205 is subjected to white balance correction and color balance correction in a color signal correcting circuit 221 and is outputted as color difference signals R-Y and B-Y.

Further, the luminance signal Y outputted from the process circuit 205 and the color difference signals R-Y, B-Y outputted from the color signal correcting circuit 221 are modulated in an encoder circuit (ENC circuit) 224 and are outputted as standard television signals. These signals are supplied to a video recorder or a monitor EVF such as an electronic view finder (not shown).

An iris control circuit 206 serves to control an iris drive circuit 207 on the basis of the picture signal supplied from the sample hold circuit 204. This circuit automatically controls ig meter to control an aperture amount of the diaphragm 202 so that a level of the picture signal becomes a predetermined level as a constant value.

The reference numerals 213 and 214 designate band pass filters (BPF) having different band limitations for extracting high frequency components required for performing focus detection, from the picture signal outputted from the sample hold circuit 204. Signals outputted from the first band pass filter 213 (BPF1) and the second band pass filter 214 (BPF2) are gated by a gate circuit 215 and a focus gate frame signal, respectively. Further, peak values thereof are detected by a peak detecting circuit 216 and are held and are inputted to a logic control circuit 217.

This signal is called as focus voltage, and the focusing is performed by this focus voltage.

Further, the reference numeral 218 designates a focus encoder for detecting a shifted position of the focus lens 201A; 219 designates a zoom encoder for detecting a focal length of the zoom lens 201B; and 220 designates an iris encoder for detecting the aperture amount of the diaphragm 202. Values detected by these encoders are supplied to the logic control circuit 217 for performing system control.

The logic control circuit 217 performs focus detection and focus adjustment of the object on the basis of the picture signal corresponding to a set focus detection area. That is to say, the logic control circuit takes in peak value information of the high frequency components supplied by the respective band pass filters 213 and 214. Further, the logic control circuit supplies control signals for a focus motor 210 such as a rotational direction signal, a rotational speed signal, a rotation/stop signal and the like to a focus drive circuit 209 to drive the focus lens 201A to a position where the peal values of the high frequency components become maximum and controls the focus motor.

What is claimed is:

1. A solid state image sensor comprising:
   a plurality of photoelectric conversion elements arranged in a two-dimensional array;
   a vertical shift register for scanning said photoelectric conversion elements in rows;
   a horizontal shift register for scanning said photoelectric conversion elements in columns; and
   reset means for setting each of various stage registers of said vertical shift register and said horizontal shift register to a predetermined reset potential, wherein:
   said vertical shift register or said horizontal shift register has a first stage register, a second and subsequent stage registers respectively connected in a cascade manner to the first stage register,
   each of the stage registers has a first inverter unit including a first switch and an inverter connected to the first switch, and a second inverter unit connected to the first inverter unit and including a second switch and an inverter connected to the second switch,
   the reset means has a first reset transistor for setting, to the predetermined reset potential, an input node of the inverter of the first inverter unit of the first stage register, and second and subseqquent reset transistors each for setting, to the predetermined reset potential, an input node of the inverter of the first inverter unit of each of the corresponding second and subsequent stage registers, and
   a timing of resetting the first stage register by the first reset transistor is different from a timing of resetting the second and subsequent stage registers by the second and subsequent reset transistors.

2. A solid state image sensor according to claim 1, wherein, when the second and subsequent stage registers are to be reset, the second and subsequent stage registers are reset using a start pulse of each shift register.

3. A solid state image sensor according to claim 2, wherein, at a timing of resetting the first stage register, the reset is performed using a pulse input only at the time of power on.

4. A solid state image sensor according to claim 3, wherein the pulse input only at the time of power on is at a high level at the power on and at a low level after the power on.

5. A solid state image sensor according to claim 1, wherein, during a timing of resetting the second and subsequent stage registers, the first switch of each of the second and subsequent stage registers is turned on.

6. A solid state image sensor according to claim 5, wherein, at a timing of resetting the first stage register, the reset is performed using a pulse input only at the time of power on.

7. A solid state image sensor according to claim 6, wherein the pulse input only at the time of power on is at a high level at the power on and at a low level after the power on.

8. A solid state image sensor according to claim 1, wherein, at a timing of resetting the first stage register, the reset is performed using a pulse input only at the time of power on.

9. A solid state image sensor according to claim 8, wherein the pulse input only at the time of power on is at a high level at the power on and at a low level after the power on.

10. A solid state image sensor comprising:
    a plurality of photoelectric conversion elements arranged in a two-dimensional array;
    a vertical shift register for scanning said photoelectric conversion elements in rows;
    a horizontal shift register for scanning said photoelectric conversion elements in columns; and
    reset means for setting various stage registers of said vertical shift register and said horizontal shift register to a predetermined reset potential, wherein:
    said vertical shift register or said horizontal shift register has a first stage register, a second and subsequent stage registers respectively connected in a cascade manner to the first stage register,
    each of the stage registers has an inverter unit including a first switch and an inverter connected to the first switch, and a second switch connected between an input node and an output node of the inverter,
    the reset means has a first reset transistor for setting, to the predetermined reset potential, an input node of the inverter of the inverter unit of the first stage register, and second and subsequent reset transistors each for setting, to the predetermined reset potential, an input node of the inverter of the inverter unit of each of the corresponding second and subsequent stage registers, and a timing of resetting the first stage register by the first reset transistor is different from a timing of resetting the second and subsequent stage registers by the second and subsequent reset transistors.

11. A solid state image sensor according to claim 10, wherein, when the second and subsequent stage registers are to be reset, the second and subsequent stage registers are reset using a start pulse of each shift register.

12. A solid state image sensor according to claim 11, wherein, at a timing of resetting the first stage register, the reset is performed using a pulse input only at the time of power on.

13. A solid state image sensor according to claim 12, wherein the pulse input only at the time of power on is at a high level at the power on and at a low level following to the power on.

14. A solid state image sensor according to claim 10, wherein, during a timing of resetting the second and subsequent stage registers, the first switch of each of the second and subsequent stage registers is turned on.

15. A solid state image sensor according to claim 14, wherein, at a timing of resetting the first stage register, the reset is performed using a pulse input only at the time of power on.

16. A solid state image sensor according to claim 15, wherein the pulse input only at the time of power on is at a high level at the power on and at a low level following to the power on.

17. A solid state image sensor according to claim 10, wherein, at a timing of resetting the first stage register, the reset is performed using a pulse input only at the time of power on.

18. A solid state image sensor according to claim 17, wherein the pulse input only at the time of power on is at a high level at the power on and at a low level following to the power on.

19. A camera comprising a solid state image sensor according to any one of claims 1-16.

20. A shift register comprising:
reset means for setting various stage registers to a predetermined reset potential, wherein:
  each of the stage registers has a first inverter unit including a first switch and an inverter connected to the first switch, and a second inverter unit connected to the first inverter unit and including a second switch and an inverter connected to the second switch,
  the reset means has a first reset transistor for setting, to the predetermined reset potential, an input node of the inverter of the first inverter unit of the first stage register, and second subsequent reset transistors each for setting, to the predetermined reset potential, an input node of the inverter of the first inverter unit of each of the corresponding second and subsequent stage registers, and
  a timing of resetting the first stage register by the first reset transistor is different from a timing of resetting the second and subsequent stage registers by the second and subsequent reset transistors.

21. A shift register comprising:
reset means for setting various stage registers to a predetermined reset potential, wherein:
  each of the stage registers has an inverter unit including a first switch and an inverter connected to the first switch, and a second switch connected between an input node and an output node of the inverter,
  the reset means has a first reset transistor for setting, to the predetermined reset potential, an input node of the inverter of the inverter unit of the first stage register, and second and subsequent reset transistors each for setting, to the predetermined reset potential, an input node of the inverter of the inverter unit of each of the corresponding second and subsequent stage registers, and
  a timing of resetting the first stage register by the first reset transistor is different from a timing of resetting the second and subsequent stage registers by the second and subsequent reset transistors.

* * * * *